(12) United States Patent
Mori

(10) Patent No.: US 12,125,722 B2
(45) Date of Patent: Oct. 22, 2024

(54) MULTI-STAGE SUBSTRATE PROCESSING SYSTEM

(71) Applicant: ASM IP HOLDING B.V., Almere (NL)

(72) Inventor: Yukihiro Mori, Machida (JP)

(73) Assignee: ASM IP Holding B.V., Almere (NL)

( * ) Notice: Subject to any disclaimer, the term of this patent is extended or adjusted under 35 U.S.C. 154(b) by 553 days.

(21) Appl. No.: 17/351,592

(22) Filed: Jun. 18, 2021

(65) Prior Publication Data

US 2021/0398826 A1    Dec. 23, 2021

Related U.S. Application Data

(60) Provisional application No. 63/041,770, filed on Jun. 19, 2020.

(51) Int. Cl.
| | | |
|---|---|---|
| H01L 21/67 | (2006.01) | |
| H01L 21/66 | (2006.01) | |
| G02F 1/13 | (2006.01) | |

(52) U.S. Cl.
CPC .... *H01L 21/6719* (2013.01); *H01L 21/67167* (2013.01); *H01L 22/20* (2013.01); *G02F 1/1303* (2013.01)

(58) Field of Classification Search
None
See application file for complete search history.

(56) References Cited

U.S. PATENT DOCUMENTS

| | | |
|---|---|---|
| 4,725,204 A | 2/1988 | Powell |
| 4,754,076 A | 6/1988 | Covey et al. |
| 5,108,792 A * | 4/1992 | Anderson ............... C30B 25/14 |
| | | 118/725 |
| 5,292,393 A | 3/1994 | Maydan et al. |
| 5,388,944 A | 2/1995 | Takanabe et al. |
| 5,399,387 A * | 3/1995 | Law .................... C23C 16/4557 |
| | | 427/166 |
| 5,494,494 A | 2/1996 | Mizuno et al. |
| 5,514,260 A | 5/1996 | Seo |
| 5,525,160 A | 6/1996 | Tanaka et al. |
| 5,538,610 A | 7/1996 | Gesche et al. |
| 5,554,249 A | 9/1996 | Hasegawa et al. |
| 5,611,655 A | 3/1997 | Fukasawa et al. |
| 5,611,886 A | 3/1997 | Bachman et al. |

(Continued)

*Primary Examiner* — Sylvia Macarthur
(74) *Attorney, Agent, or Firm* — Snell & Wilmer L.L.P.

(57) ABSTRACT

A vacuum process module has a pre-shaped ceiling and/or bottom that is shaped to bulge outwards. The shape of the ceiling and/or process modules counteracts deformation caused by vacuum pressures and/or high temperatures when processing substrates in the process module. The process module may have a side openable to a transfer chamber and an opposite side opposite the openable side. The bulge may be asymmetric, with the peak of the bulge off-center on the ceiling and closer to the opposite side than to the openable side. A rigid structure may be mounted on the ceiling to adjust the magnitude of the bulge in the ceiling. The beam may be, e.g., a rigid beam having an adjustable lift mechanism for lifting up an attached part of the ceiling. The process module may accommodate a plurality of substrates for processing, with each substrate occupying a dedicated stage in the process module.

19 Claims, 9 Drawing Sheets

(56) References Cited

U.S. PATENT DOCUMENTS

| | | | |
|---|---|---|---|
| 5,616,208 A | 4/1997 | Lee | |
| 5,695,567 A * | 12/1997 | Kordina | C30B 31/14 |
| | | | 118/725 |
| 5,753,044 A * | 5/1998 | Hanawa | H01J 37/321 |
| | | | 118/723 I |
| 5,755,888 A | 5/1998 | Torii et al. | |
| 5,855,681 A | 1/1999 | Maydan et al. | |
| 6,077,157 A * | 6/2000 | Fairbairn | C23C 16/54 |
| | | | 454/49 |
| 6,093,252 A | 7/2000 | Wengert et al. | |
| 6,152,070 A | 11/2000 | Fairbairn et al. | |
| 7,108,753 B2 | 9/2006 | Wood | |
| 7,169,233 B2 | 1/2007 | Wood | |
| 7,663,121 B2 | 2/2010 | Nowak et al. | |
| 7,777,198 B2 | 8/2010 | Rocha-Alvarez et al. | |
| 7,910,897 B2 | 3/2011 | Schmitt | |
| 8,157,915 B2 * | 4/2012 | Dauelsberg | C23C 16/4405 |
| | | | 118/724 |
| 8,172,950 B2 * | 5/2012 | Yanagisawa | H01L 21/67115 |
| | | | 156/345.52 |
| 8,203,126 B2 | 6/2012 | Rocha-Alvarez et al. | |
| 8,435,379 B2 * | 5/2013 | Mehta | H01L 21/02046 |
| | | | 156/345.43 |
| 10,804,121 B2 * | 10/2020 | Hamada | H01L 21/67075 |
| 2017/0044666 A1 * | 2/2017 | Jang | C30B 25/12 |
| 2017/0338097 A1 * | 11/2017 | Okutani | H01L 21/02046 |
| | | | 156/345.43 |
| 2018/0033674 A1 * | 2/2018 | Jeong | H01L 21/68771 |
| 2021/0035840 A1 * | 2/2021 | de Ridder | H01L 21/67769 |
| 2021/0229056 A1 | 7/2021 | Alvandi-Tabrizi et al. | |
| 2021/0287878 A1 * | 9/2021 | Um | H01J 37/32183 |
| 2021/0371976 A1 * | 12/2021 | Roh | C23C 16/4412 |
| 2021/0398826 A1 * | 12/2021 | Mori | H01L 21/67766 |

* cited by examiner

| Temperature (°C) | Inward Sag (mm) | |
|---|---|---|
| | Simulation | Measurement |
| Room Temperature | -0.44 | -0.46 |
| 75 | -0.54 | |
| 150 | -0.77 | -0.76 |

FIG. 8

MULTI-STAGE SUBSTRATE PROCESSING SYSTEM

BACKGROUND

Field

The present application relates to substrate processing systems and, more particularly, to the substrate processing modules in which substrates are processed.

Background

Manufacturing semiconductor devices, such as in integrated circuit fabrication, typically involves subjecting a substrate (such as a semiconductor wafer) to many processes, such as polishing, deposition, etching, photolithography, heat treatment, etc. Due to stringent demands on the quality of process results, in some cases, these different processes may be conducted in dedicated chambers that are configured to process a single substrate at a time. To increase process throughput and lower process costs, processing modules have been developed in which a plurality of substrates are accommodated and processed side-by-side. Each substrate may desirably have a similar and uniform local environment within the process module, to provide uniform process results between the substrates.

Accordingly, there is a continuing need for substrate processing systems that provide a uniform local environment for substrate processing.

SUMMARY

In some embodiments, a process module for processing a substrate comprises a plurality of stages each configured to accommodate a substrate, and a housing enclosing the stages, the housing comprising a bottom, a ceiling, and sidewalls extending from the bottom to the ceiling. As seen in a cross-sectional side view, a shape of the ceiling defines an upwardly extending bulge.

In some embodiments, the housing further comprises a rigid structure disposed over and across the ceiling, the rigid structure comprising a lift mechanism attached to the ceiling for maintaining an upward extension of the bulge.

In some embodiments, the lift mechanism is adjustable for adjusting the height of the bulge. The lift mechanism may comprise a threaded rod attached to a corresponding threaded portion of the ceiling, where a height of an apex of the bulge is adjustable by relative rotation of the rod and the corresponding threaded portion of the ceiling.

In some embodiments, the rigid structure comprises a rigid beam.

In some embodiments, the ceiling is a lid assembly comprising a plurality of lids corresponding to the plurality of stages, and wherein the rigid structure extends between pairs of the lids.

In some embodiments, a plurality of lids is disposed over respective ones of the stages, wherein the plurality of lids are non-parallel to the respective stages. A total number of the stages and the number of the lids may be four each, wherein the stages and the lids are each arranged in a 2×2 matrix. An apex of the bulge protrudes within a range of 0.2 millimeters to 4 millimeters higher than a periphery of the ceiling.

In some embodiments, the bottom of the housing extends outward to form a convex shape.

In some embodiments, a process module for processing a substrate comprises one or more stages each configured to accommodate a substrate, a housing enclosing the one or more stages, the housing comprising a bottom, a ceiling, and sidewalls extending from the bottom to the lid assembly, and a rigid structure disposed over the ceiling. The rigid structure comprises an adjustable lift mechanism attached to the ceiling for changing a shape of the ceiling.

In some embodiments, the rigid structure comprises a beam extending over and across the ceiling. In some embodiments, the lift mechanism comprises a male thread, and a female thread configured to be coupled with and rotatable relative to the male thread. One of the male and female threads is attached to the rigid structure and the other of the male and female threads is attached to the ceiling.

In some embodiments, the number of the stages and the number of the lids are four, and the stages and the lids are each arranged in a 2×2 matrix, and the rigid structure is disposed between two rows of two lid.

In some embodiments, the lift mechanism is attached to the ceiling at an off-center point of the ceiling, as seen in a top-down view.

In some embodiments, a semiconductor processing system comprises a transfer chamber, and one or more processing modules attached to the transfer chamber. The one or more processing modules comprise a plurality of stages each configured to accommodate a substrate, and a housing enclosing the one or more stages. The housing comprises a bottom, a ceiling, a door openable to the transfer chamber, and a sidewall opposite the door and extending from the bottom to the ceiling. The ceiling has a convex shape as seen in a cross-section sideview. The convex shape has an apex closer to the sidewall opposite the door than to the openable door.

In some embodiments, each stage has a respective lid, wherein the ceiling is a lid assembly, and the convex shape is changeable into a flat shape, in which the lids are parallel to the respective stages, upon processing the substrates on the stages.

In some embodiments, the process module further comprises a rigid structure having a lift mechanism for adjusting a shape of the ceiling. The lift mechanism comprises a male thread, and a female thread configured to be coupled with and be rotatable relative to the male thread. One of the male and female threads is attached to the rigid structure and the other of the male and female threads is attached to the ceiling.

In some embodiments, a method for processing semiconductor substrates comprises providing a semiconductor process module, determining one or both of a process temperature and a process pressure for a semiconductor process, and adjusting a shape of the ceiling with the lift mechanism based upon one or both of the process temperature and process pressure. The semiconductor process module comprises a housing enclosing a plurality of stages for accommodating a plurality of semiconductor substrates for processing and a rigid structure disposed over the ceiling. The rigid structure comprises an adjustable lift mechanism attached to the ceiling for changing a shape of the ceiling. The housing comprises a bottom, a ceiling, and sidewalls extending from the bottom to the ceiling. The lid assembly comprises a plurality of lids each corresponding to one of the plurality of stages.

In some embodiments, adjusting the shape of the ceiling with the lift mechanism comprises changing the shape of the ceiling based upon both the process temperature and process pressure.

In some embodiments, adjusting the shape of the ceiling with the lift mechanism comprises increasing a height of a portion of the ceiling attached to the lift mechanism.

In some embodiments, the method further comprises heating the plurality of stages to the process temperature and evacuating the plurality of stages to the process pressure.

In some embodiments, the method further comprises subsequently processing a plurality of semiconductor substrates in the plurality of stages.

In some embodiments, heating the plurality of stages to the process temperature and evacuating the plurality of stages to the process pressure flattens an upward deflection of the shape of the ceiling In some embodiments, the lids are parallel to the stages during processing semiconductor substrates.

In some embodiments, processing semiconductor substrates comprises processing LCD panels.

BRIEF DESCRIPTION OF THE DRAWINGS

FIG. 8 is a table showing a relationship between temperature inside the process module and inward deformation of the ceiling of the process module under vacuum.

DETAILED DESCRIPTION

Figure 1:
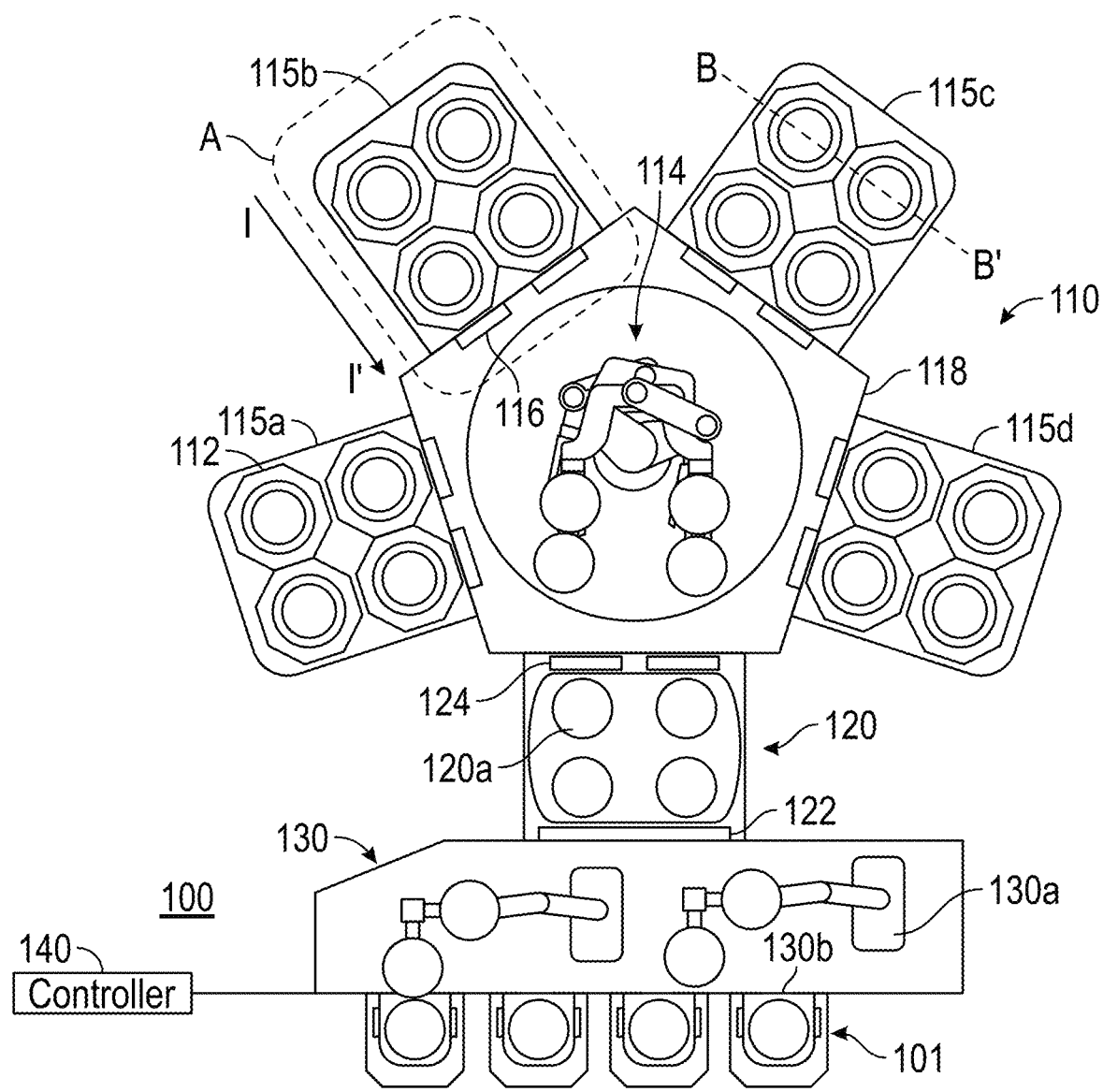
FIG. 1 is a schematic plan view of a substrate processing system equipped with a process module assembly.

As discussed herein, process throughput may be increased by increasing the sizes of substrate processing modules, such that they accommodate and simultaneously process multiple substrates at a time. In addition, the sizes of the substrates themselves have increased over time. These and other factors have increased the sizes of process modules. As process module sizes have increased, their susceptibility to external gas pressures has also increased.

In some cases, this susceptibility may be exacerbated by the materials used to form the process modules. For example, some process modules may be made of aluminum, which has advantages for providing low levels of heavy metal contamination on processed devices and for being resistant to chemical corrosion caused by exposure to process gases. Process modules for using aluminum, however, may be relatively easily deformed.

For many processes, the insides of process modules may be evacuated to provide a low pressure processing environment for substrates accommodated therein. This may expose the process modules to exceptionally large pressure differences between the inside of the process module and outside environment. For example, in some processing pressures, a compressive force caused by several tons of atmospheric pressure may be exerted on the process module. Undesirably, this compressive force may deform the wide top and/or bottom parts of the process module housing. This deformation may cause the top and/or bottom parts of the process module housing to bend inwards, which may negatively impact the process environment around a substrate, thereby negatively impacting the process results for the substrates. In addition, it will be appreciated that substrate processing may occur at elevated temperatures, and these high temperatures may further contribute to the deformation of the process module.

In some embodiments, a vacuum process module has a volume which is defined by a bottom, a ceiling, and walls extending between the bottom and ceiling. The process module may accommodate a plurality of substrates for processing, with each substrate occupying a dedicated "stage" in the process module. In some embodiments, each stage may have an associated substrate support and lid, with the lids of each stage together forming a lid assembly. The stages may also have interior partitions separating them from other stages. The ceiling and the bottom extend across and encompass all of the stages. The ceiling and/or process module bottom is shaped to bulge outwards to form a convex shape to counteract deformation caused by vacuum pressures and/or high temperatures while processing substrates in the process module. In some embodiments, the ceiling and/or process module bottom is "pre-shaped," or has a shape with a bulge of a particular size that is calibrated such that the ceiling and process module bottom are substantially parallel upon being compressed when exposed to the vacuum pressures and temperatures of substrate processing.

In some embodiments, the outward bulge may be formed using a rigid structure disposed over the ceiling and/or under the process module bottom. For example, the rigid structure may be mounted across the ceiling. The rigid structure may be attached to an adjustable lift mechanism for adjusting the magnitude of the bulge in the ceiling. For example, the adjustable lift mechanism may be a threaded rod which may be rotated relative to a mating threaded portion of the ceiling, to increase or decrease the magnitude of that upward extent of the bulge or convex shape. In some embodiments, the rigid structure may be a beam.

The process module may be part of a semiconductor processing system having a transfer chamber. The process module may have an openable side with a door that may be opened to provide access between the process module and the transfer chamber. In some embodiments, the ceiling bulge may be asymmetric, with the peak of the bulge off-center on the ceiling. For example, the apex of the bulge may be farther from the openable side than the side of the process module opposite the openable side.

Advantageously, the shape of the ceiling and/or process module bottom may resist deformation or be biased such that, even with an expected amount of deformation, the ceiling and the process module bottom are substantially parallel during processing. It will be appreciated that providing such a process environment may improve process results relative to not pre-shaping the process module. For example, the shape ceiling and/or process module bottom may provide a more uniform processing environment, which may include improving precursor access to substrate surfaces. As a result, process yield and/or the quality of process results may be improved.

Reference will now be made to the figures, in which like numerals refer to like parts throughout.

FIG. 1 is a schematic plan view of a substrate processing system 100 equipped with a process module assembly 110. The process module assembly 110 may comprise multiple process modules 115a, 115b, 115c, 115d arrayed around a central transfer chamber 118. Each of the process modules 115a, 115b, 115c, 115d may comprise a plurality of reaction chambers 112 for processing substrates, with one substrate accommodated in a dedicated chamber during processing. In the illustrated embodiment, four process modules are shown. In some other embodiments, the substrate processing system 100 may include various other numbers of process module assemblies as, for example, five, six, etc. process module assemblies.

The processing system 100 may further include a controller 140 which may include hardware microprocessors, microcontrollers, programmable logic controllers, dedicated hardware, and/or memory or the like. It will be appreciated that the various pieces of hardware forming the controller 140 may be resident in a common location, or may be distributed pieces of hardware that are in communication with one another. The controller may be programmed or otherwise configured to cause the various processes, and related actions, described herein to be conducted. The processes may include, for example, any of the loading, processing, determining process pressures and/or temperatures, adjusting ceiling and/or bottom shape, and/or unloading sequences described herein. In some embodiments, the processes may be programmed into the controller by being stored as instructions in a non-transitory computer-readable medium (e.g., a memory). The controller may be in communication with and configured to send instructions to the various power sources, heating systems, pumps, robotics (e.g., substrate transport arms), and gas flow controllers or valves of the processing system 100 to effectuate the processes in the programming, as will be appreciated by the skilled artisan.

The substrate processing system 100 may further comprise a load lock chamber 120 and a transport chamber 130. The transfer chamber 118 may include substrate transfer device 114, which may be a transfer arm. The substrate transfer device 114 is configured to receive a substrate and to transfer the substrate to one of the process modules 115a, 115b, 115c, 115d. Module doors 190, schematically illustrated as pairs of rectangular partitions, are disposed between each process module 115a, 115b, 115c, 115d and the transfer chamber 118. It will be appreciated that the module doors 116 may be resealable closures such as gate valves and the number of the module door(s) 116 in FIG. 1 is for illustration purposes only and may be varied as desired for substrate access and sealing between volumes. For example, the module door(s) 116 for one of process modules 115a, 115b, 115c, 115d may be opened when the substrate transfer device 114 transfers a substrate into or from that one of process modules 115a, 115b, 115c, 115d. The corresponding module door(s) 116 may be closed after the substrate is transferred into or removed from the one of process modules 115a, 115b, 115c, 115d. It will be appreciated that the operation of the module door(s) 116, substrate transfer device 114, etc. may be controlled by the controller 140.

With continued reference to FIG. 1, as discussed herein, in some embodiments, the process module assembly 110 may have a plurality of process modules, e.g., four first process modules 115a, 115b, 115c, 115d, which may each be similar. In some embodiments, each process module 115a, 115b, 115c, 115d may include a plurality of reaction chambers 112, e.g., four first reaction chambers 112. As illustrated, the four reaction chambers 112 may be arranged in a 2×2 matrix, but it will be appreciated that other arrangements are possible. Each of the reaction chambers 112 may be used to process a substrate. Preferably, each of the reaction chambers 112 is a single-substrate chamber configured to process a single substrate at a time. For example, the reaction chambers 112 may be sized and have a substrate support configured to accommodate only a single substrate. In some embodiments, the reaction chambers 112 may be plasma enhanced chemical vapor deposition (CVD) reaction chambers, thermal CVD reaction chambers, plasma enhanced atomic layer deposition (ALD) reaction chambers, thermal ALD reaction chambers, etching reaction chambers, UV-curing reaction chambers, etc.

In some embodiments, the substrate transfer device 114 may be a transfer arm that includes two or more transfer sub-arms. In some embodiments, a main driving portion of each of the two or more transfer sub-arms may have various articulating structures, e.g., a 3-link selective compliant articulated robot arm (SCARA), a 4-link SCARA, a bisymmetric arm, a frog-leg/scissors type arm, and a linear sliding arm. Each of the two or more transfer sub-arms may include one or more end effectors. For example, each of the two or more transfer sub-arms may include a plurality of end effectors, e.g., two end effectors. The number of end effectors may be equal to the number of stations arranged as a matrix in the load-lock chamber 130 or the number of the reaction chambers 112 in one process modules 115a, 115b, 115c, 115d shown in FIG. 1.

Each process module 115a, 115b, 115c, 115d may be connected to the transfer chambers 112 via a module door 116. The module door 116 may be configured to may be opened and closed to provide access to and to isolate, respectively, the reaction chambers 112 from the transfer chamber 118. For example, the reaction chambers 112 may be isolated from the transfer chamber 118 after transferring a substrate into the reaction chambers 112 and while the substrate is processed. Thus, a highly controlled process environment in the reaction chambers 112 may be maintained and cross contamination (e.g., between different process modules) may be prevented.

With continued reference to FIG. 1, the load-lock chamber 120 may include a plurality of load lock stations 120a. The transport chamber 130 may include a plurality of load ports 130b for interfacing with external substrate carriers 101 and a plurality of actuators 130a, e.g., robot arms, for moving substrates from the substrate carriers 101 to the load lock stations 120a. In some embodiments, the transport chamber 130 may be an equipment front end module (EFEM). In some embodiments, the substrate carriers 101 front opening unified pods (FOUPs).

In some embodiments, the load lock chamber 120 may be connected to the transport chamber 130 via a transport door 122 (e.g. a gate valve), and to the transfer chamber 135 via a load lock door 124 (e.g. a gate valve). In some embodiments, the transport chamber 130 and the transfer chamber 118 may be connected to opposite sides of the load lock chamber 120. The load lock chamber 120 may be configured to provide a vacuum atmosphere that is approximately equal to the pressure in the transfer chamber 118 when the substrate transfer device 114 of the transfer chamber 118 loads or unloads substrates into or from the load lock chamber 120. Similarly, pressure within the load lock chamber 120 may be changed to match the pressure in the transport chamber 130 when receiving an unprocessed substrate from the transport chamber 130 or returning a processed substrate to the transport chamber 130. A plurality of load lock stations 120a may be provided in the load lock chamber 120. As illustrated, the load lock stations 120a may be arranged in a 2×2 matrix, but other arrangements are possible. The load lock door(s) 124 may be disposed between the transfer chamber 118 and the load lock chamber 120. It will be appreciated that the number of load lock door(s) 124 in FIG. 1 is for illustrative purposes and may be varied. The load lock door(s) 124 may be opened when the substrate transfer device 114 transfers a substrate into or out from the load lock chamber 120. The load lock door(s) 124 may be closed after the substrate is transferred into or out from the load lock chamber 120. The operation of the load lock door(s) 124, transfer arms, etc. may be controlled by the controller 140.

The transport chamber 130 may include a door opener (not illustrated) for opening and closing a door of the load ports 130b, to provide access for the robot arms 130a that transfer substrates between the load ports 130b and the load lock chamber 120. The robot arms 130a may be moveable in the transport chamber 130, for example, using a guide rail for guiding the movement of the robot arms 130a. The load ports 130b contain the substrates in a sealed space (e.g. the interior of an interfacing substrate carrier) so as to protect the substrates against impurities in the atmosphere or chemical pollution. In some embodiments, two robot arms 130a are provided and each robot arm 130a may include two transfer arms. Accordingly, four substrates may be transferred from the load ports 130a into the load lock chamber 120 at the same time. As illustrated, it will be appreciated that, in some embodiments, the number of substrates (e.g., four substrates) that may be simultaneously transferred by the robot arms 130a is equal to the number of load lock stations 120a, which in turn may be equal to the number of reaction chambers in each process module of the various process module assemblies.

Figure 2:
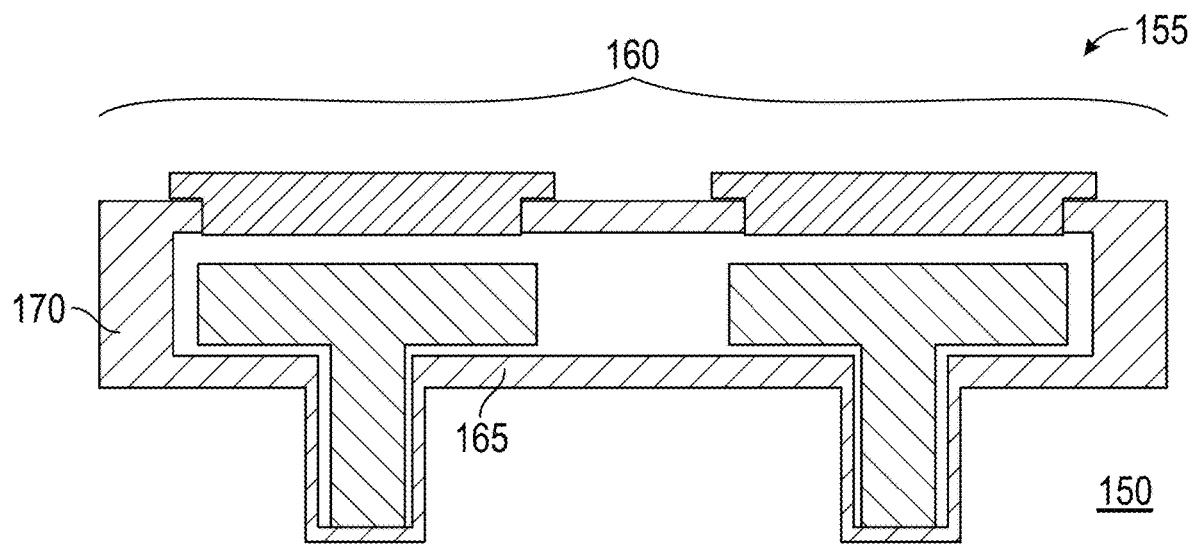
FIG. 2 is an example of a schematic cross sectional view of a process module which may be utilized in the substrate processing system of FIG. 1.

FIG. 2 is an example of a schematic cross sectional view of a process module which may be utilized in the substrate processing system of FIG. 1. The process module 150 includes a housing 155 comprising a ceiling 160, a bottom 165, and sidewalls 170 extending from the bottom 165 to the ceiling 160. The ceiling 160 and the bottom 165 may be flat and may each define a horizontal plane. The ceiling 160 is parallel to the bottom 165.

Figure 3:
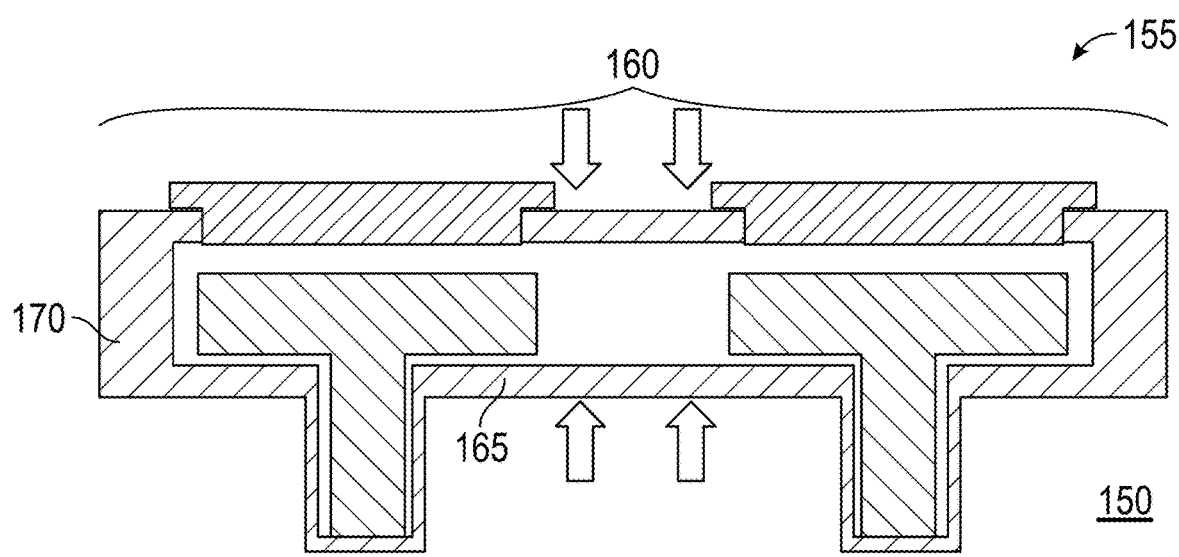
FIGS. 3 and 4 are schematic crosssectional sideviews of the process module of FIG. 2, illustrating deformation of the process module.
Figure 4:
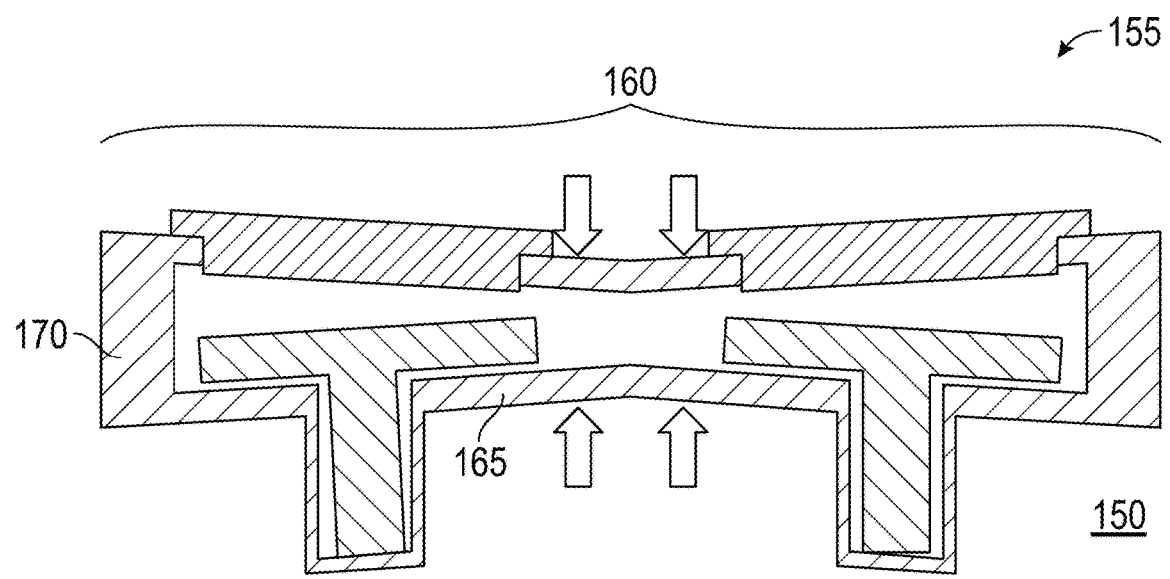

FIGS. 3 and 4 are schematic cross-sectional side views of the process module 150 of FIG. 2, showing the deformation of the ceiling 160 and bottom 165 when a relatively large external pressure is applied to the process module 150. Typically, a process for depositing a layer on a substrate such as CVD and ALD may be performed under very low pressures. Due to the large pressure difference between the inside of the process module 150 and the outside ambient, the atmospheric pressure (which may be several tons) compressing the ceiling 160 and the bottom 165 may be large, as illustrated by the arrows in FIG. 3. This pressure may deform the shape of the ceiling 160 and/or the bottom 165 as illustrated in FIG. 4. For example, both the ceiling 160 and the bottom 165 may be compressed in words; a center portion of the ceiling 160 may sink due to the high pressure and a center portion of the bottom 165 may lift inside the housing 155. This may negatively impact process results. For example, when the ceiling 160 and/or the bottom 165 are deformed and not parallel each other, the uniformity of a plasma generated between those two structures may be negatively affected.

Figure 5:
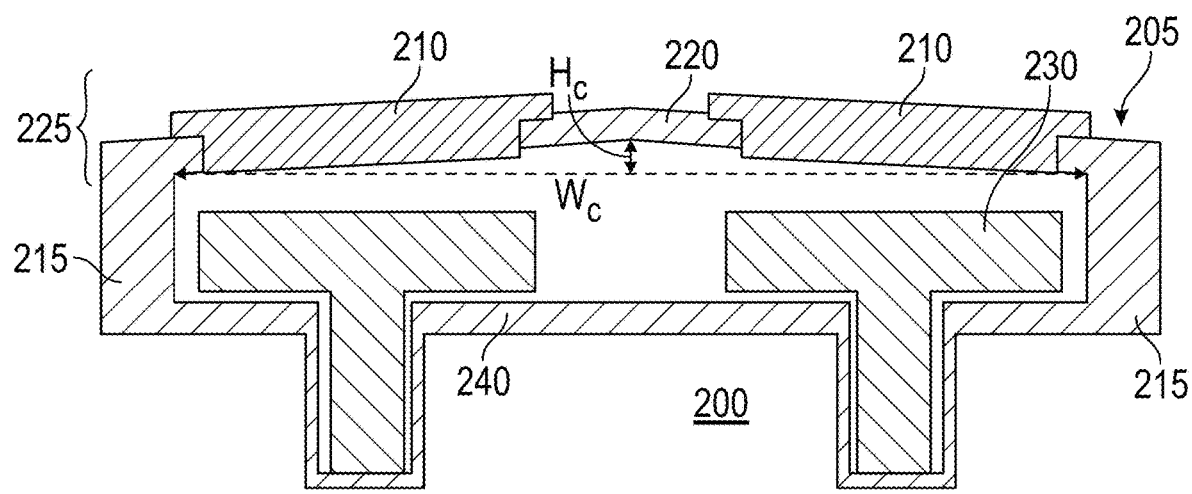
FIGS. 5-7 are examples of process module having a housing with convex ceilings and/or bottoms.
Figure 6:
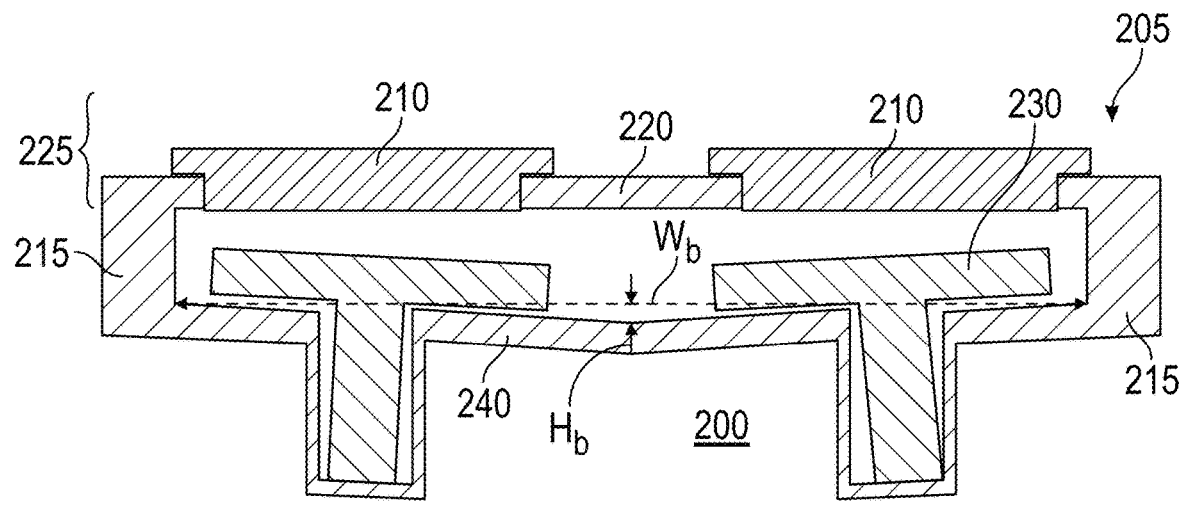
Figure 7:
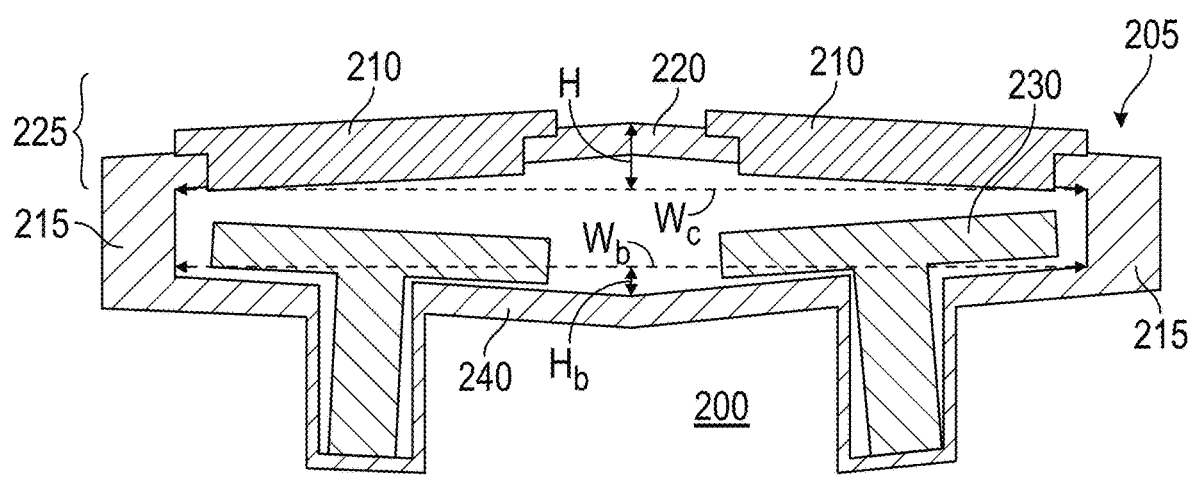

FIGS. 5-7 are examples of embodiments of a process module of the substrate processing system. Each figure may be understood to be a schematic cross sectional view of one of the process modules of the substrate processing system of FIG. 1, with the cross-section taken along the plane B-B'. With reference to FIG. 5, the process module 200 includes a plurality of stages 230 and a housing 205 in which the stages 230 are disposed. Each stage 230 may comprise a substrate support, for supporting a substrate during processing. It will be appreciated that each of the stages 230 may correspond to one of the reaction chambers 112 (FIG. 1). In addition, the stages may be separated by partitions (not illustrated) in some embodiments.

With continued reference to FIG. 5, the housing 205 comprises a ceiling 225, a bottom 240, and sidewalls 215 extending from the bottom 240 to the ceiling 225. As discussed herein, the sidewalls 215 extend between the ceiling 225 and the bottom 240 to form a space in which the stages 230 are disposed and processes are performed. In some embodiments, the ceiling 225 may be a lid assembly, comprising a frame 220 and a plurality of lids 210. As illustrated, the stages 230 for accommodating a substrate are disposed in the housing 205, and the corresponding lids 210 are disposed over the respective stages 230. The frame 220 may have openings into which each lid 210 may be inserted to seal the housing 205. In some embodiments, the lids 210 may facilitate generation of a plasma in a space between a respective stage 230 and lid 210. A gas pipe (not shown) and openings for supplying a gas into the space between the stage 230 and the lid 210 may be formed through the lid 210. It will be appreciated that the process modules of FIGS. 5-7 may correspond to some the process modules 115a, 115b, 115c, 115d illustrated in FIG. 1.

Referring to FIG. 5, the ceiling 225 has a shape that bulges outwards, such that the interior surface of the ceiling extends upwards. In some embodiments, the interior surface of the ceiling 225 may have a convex shape, an arc shape, a pyramid shape, and/or a curved shape. In some embodiments, the lid 210 may be tilted. For example, as illustrated, the lid 210 may be approximately parallel to the portion of the ceiling 225 to which it is attached and, as such, may be tilted relative to a horizontal plane. In some embodiments, the exterior surface of the ceiling 225 protrudes upwards.

In some embodiments, a central portion of the ceiling 225 may protrude upwards relative to a peripheral portion of the ceiling 225 (e.g., relative to the peripheral portion of the ceiling 225 in contact with the sidewalls 215). In some embodiments, at the apex of the interior bulge, height $H_c$ of the central portion may be in the range 0.2 mm to 2.0 mm, 0.3 mm to 3.0 mm, or 0.4 mm to 4.0 mm. It will be appreciated that height $H_c$ may vary depending upon the width $W_c$ of the ceiling 225, such that $H_c$ may increase as $W_c$ increases. In some embodiments, the ceiling 225 may have a width $W_c$ in the range 500 mm to 1000 mm, 1000 mm to 1500 mm, or 1500 mm to 2000 mm, corresponding to the values of $H_c$ noted above. In addition, as discussed herein, process pressures and/or process temperatures may also impact the degree of deformation of the ceiling 225 and, as a result, the magnitude of the height $H_c$. For example, $H_c$ may increase with increases in the pressure differential between the interior pressure of the process module 200 and the ambient pressure outside of the process module 200 (assuming that the ambient pressure is higher than the interior pressure). Alternatively or in addition, $H_c$ may increase with increases in process temperature, since increases in temperature may soften materials (e.g., metals) forming the ceiling 225.

In some embodiments, the shape of the ceiling 225 and the height $H_c$ may be selected such that, upon being deformed during substrate processing, the height $H_c$ decreases to a level at which the ceiling 225 and the lids 210 are substantially parallel to the stages 230 and any substrates being processed at the stages 230. As discussed herein, deformation of the ceiling 225 during processing may be particularly problematic in process modules containing multiple stages/or processing large substrates.

In some embodiments, a central portion of the bottom 240 may bulge outwards (e.g., downwards) when compared to a peripheral portion of the bottom 240, e.g., the peripheral portion of the bottom 240 in contact with the sidewalls 215. In some embodiments, the interior surface of the bottom 240 may have a convex shape, an arc shape, an upside down pyramid shape, and/or a curved shape. The stages 230 may be tilted and substantially parallel to a portion of the bottom 240 at which the stages 230 are disposed. In some other embodiments, the stages 230 are not tilted and are approximately parallel to the ceiling 225 and the lids 210. In some embodiments, at its lowest point, the outward bulge in the bottom 240 may extend downwards to a height $H_b$ relative the peripheral portion of the bottom 240 in contact with the sidewalls 215. In some embodiments, $H_b$ may be in the range 0.2 mm to 2.0 mm, 0.3 mm to 3.0 mm, or 0.4 mm to 4.0 mm. As with the height $H_c$, it will be appreciated that height $H_b$ may vary depending upon the width $W_b$ of the bottom 240, such that $H_b$ may increase as $W_b$ increases. In some embodiments, the bottom 240 may have a width $W_b$ in the range 500 mm to 1000 mm, 1000 mm to 1500 mm, or 1500 mm to 2000 mm, corresponding to the values of $H_b$ noted above. As also discussed herein, where the ambient pressure is higher than the interior pressure, the magnitude of the height $H_b$ may increase with increases in the pressure differential between the interior pressure of the process module 200 and the ambient pressure outside of the process module 200. In some embodiments, $H_b$ may also increase with increases in process temperature.

With reference now to FIG. 7, both the ceiling 225 and the bottom 240 may bulge outwards, as discussed above regarding FIG. 5 and FIG. 6, respectively. As discussed herein, in some embodiments, each of the ceiling 225 and the bottom 240 may have a convex shape, an arc shape, a pyramid shape and/or a curved shape. The shape of the ceiling 225 and the bottom 240 may be adjusted to be effectively be flattened (to become substantially parallel) during processing, e.g., in response to the pressure difference generated during processing a substrate inside the process module 200. In some embodiments, during processing, the ceiling 225 and the lids 210 are parallel to the stages 230.

FIG. 8 is a table showing the relationship between temperature inside the process module and the inward sage of the ceiling. The pressure inside the process module was kept constant at 3.0 Torr, with an outside ambient pressure of 1 atm. As discussed herein, the amount of sag increases with temperature. Notably, the simulation provides a good approximation of the actual measured sag, indicating that the effective pre-shaping of the ceiling and/or bottom of the process module may be implemented based on expected process conditions. In some embodiments, Hc (FIGS. 5-7) may be substantially equal to the inverse of the expected sag.

Figure 9:
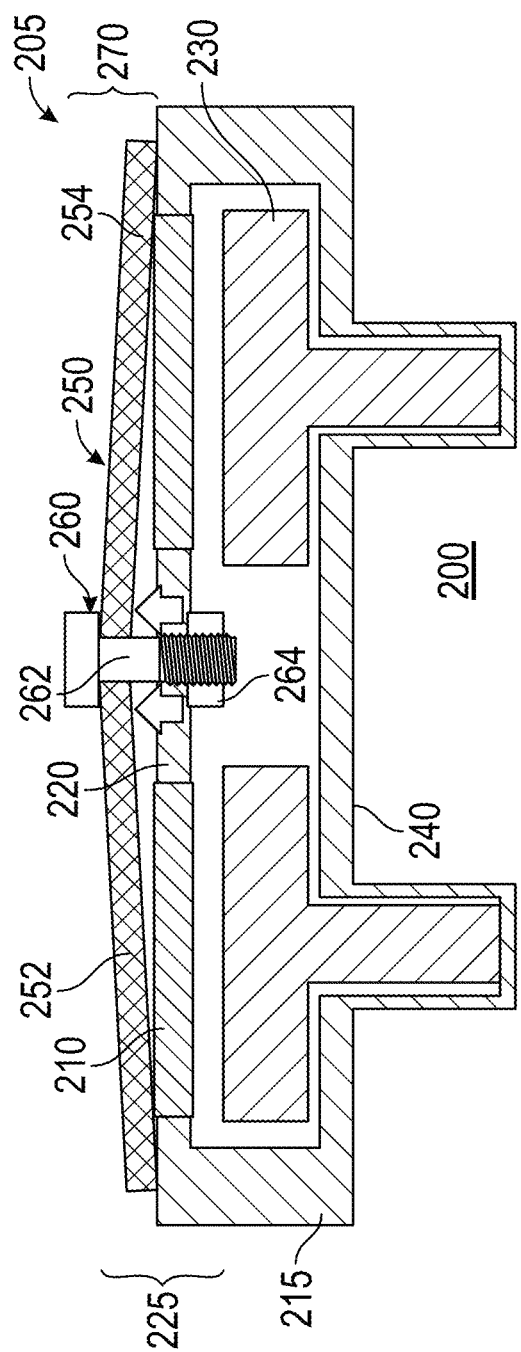
FIG. 9 is another example of a schematic cross-sectional view of a process module with a convex ceiling.
Figure 10:
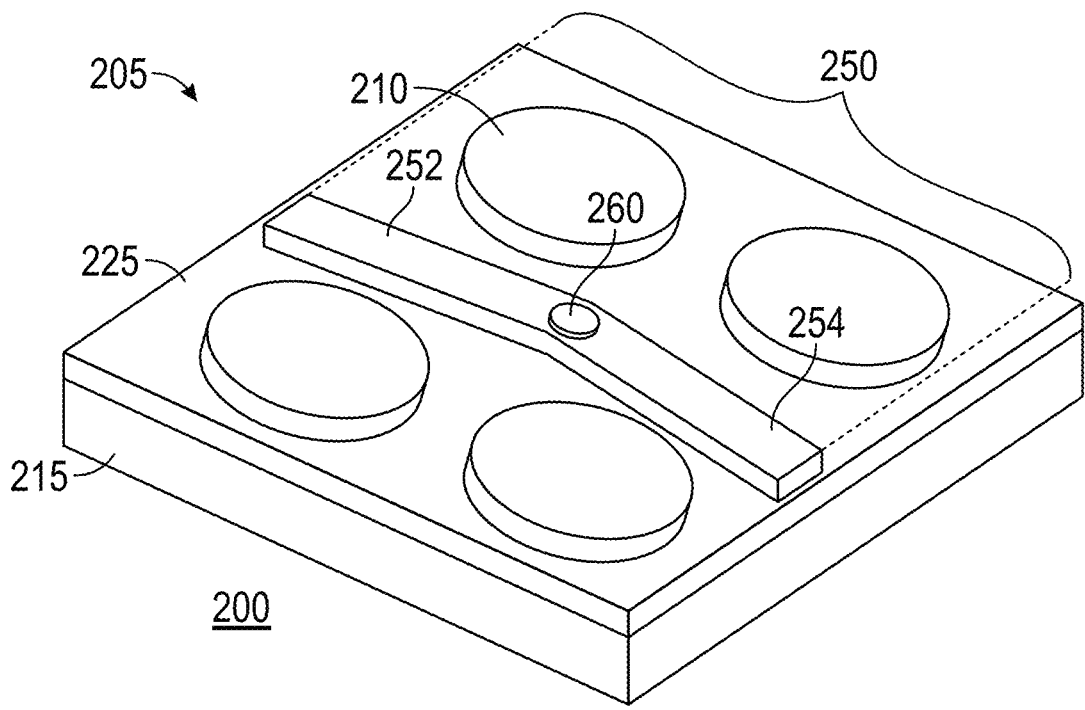
FIG. 10 is an example of a perspective view of the process module of FIG. 9.

FIG. 9 is another example of a schematic cross-sectional view of a process module with a convex ceiling. FIG. 10 is an example of a perspective view of the process module of FIG. 9.

The illustrated process modules of FIGS. 9 and 10 are similar to those illustrated in FIGS. 5-7, with FIGS. 9 and 10 providing additional details regarding a technique for achieving the desired shape of the ceiling. With reference to FIG. 9, as discussed herein, the process module 200 includes a plurality of stages 230 and a housing 205 in which the stages 230 are disposed. The housing 205 comprises a ceiling 225, sidewalls 215, and a bottom 240. The ceiling 225 may include a plurality of lids 210 in some embodiments.

With continued reference to FIG. 9, a rigid structure 270 may be provided over and mechanically connected to the ceiling 225. The rigid structure 270 may adjust a shape of the ceiling 225 and, preferably, has greater rigidity than the underlying ceiling 225. The rigid structure 270 may apply a force to lift up the ceiling 225, e.g., at the point of connection with the ceiling 225, to cause the connected portion of the ceiling 225 to move up, e.g., by an amount $H_c$ (FIGS. 5 and 7). As result, the ceiling 225 may assume a convex shape, an arc shape, a pyramid shape, a curved shape, etc.

Figure 11:
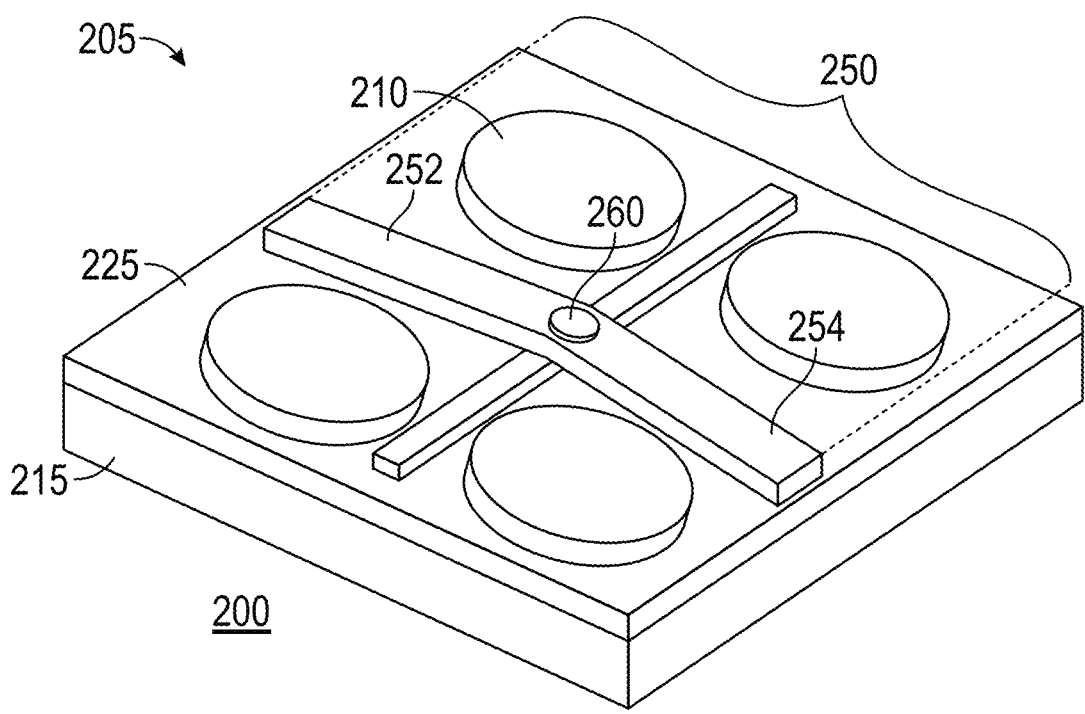
FIG. 11 is another example of a perspective view of the process module of FIG. 9.

In some embodiments, the rigid structure 270 may comprise a beam 250 and a lift mechanism 260. The beam 250 may be disposed over and across the ceiling 225. The beam 250 may be disposed between the lids 210 as illustrated in FIG. 11. As discussed herein, the beam 250 may be more rigid than the ceiling 225. In some embodiments, the beam 250 may be comprised of a material that is different than the material forming the ceiling 225. For example, the bar may be formed of Steel, while the ceiling may be formed of another material, such as aluminum. In some other embodiments, the rigid structure 270 and the ceiling 225 may be formed of the same or similar materials, and the enhanced rigidity of the rigid structure 270 may be provided based upon the shape and size of that structure.

With continued reference to FIG. 9, the ends of the rigid structure 270 may be coupled to the housing 205. For example, one end of the rigid structure 270 may be coupled to one edge portion of the ceiling 225 and the other end of the rigid structure 270 may be coupled to an opposite edge portion of the ceiling 225. It will be appreciated that the rigid structure 270 may be coupled to the housing 205 by various means, including by welding, mechanical fasteners, etc.

In some embodiments, a central portion of the rigid structure 270 may be over and spaced away from the ceiling 225. The rigid structure 270 may comprise the beam 250, which may comprise two bar segments 252 and 254 as illustrated in FIG. 10. The bar segments 252 and 254 may make an obtuse angle between them so that there is a gap between the beam 250 and the ceiling 225. Alternatively, the bar may have any shape which provides a gap between the rigid structure 270 and the ceiling 225, for example, an arc shape. In some other embodiments, the rigid structure 270 may simply be a straight beam spaced apart from the ceiling 225 by spacers.

With continued reference to FIG. 9, the lift mechanism 260 is mounted roughly at a central portion of the rigid structure 270 and the ceiling 225. In some embodiments, the lift mechanism 260 may extend through the rigid structure 270 and the ceiling 225, e.g., the frame 220. The lift mechanism 260 connects the rigid structure 270 and the ceiling 225. In some embodiments, the lift mechanism 260 may comprise a threaded rod 262 and a threaded receiving portion 264 in the ceiling 225. The threaded rod 262 may be disposed over and through the beam 250 and the threaded portion 264 may extend through an below the ceiling 225. The threaded rod 262 may have a male thread and the threaded portion 264 may have a female thread. When the male thread of the rod 252 and the female thread of the portion 264 are rotated relative to one another in a first direction, the ceiling 225 moves toward the space between the ceiling 225 and the beam 250 so that a central portion of the ceiling 225 is higher that a peripheral portion of the ceiling 225, thereby increasing the height $H_c$ (FIGS. 5 and 7). As a result, the ceiling 225 may have a convex shape. Rotating the male thread of the rod 252 and the female thread of the portion 264 and opposite direction may lower the ceiling 225, thereby decreasing the height $H_c$ (FIGS. 5 and 7).

FIG. 11 is another example of a perspective view of the process module of FIG. 9. In some embodiments, the rigid structure 270 comprises a plurality of bars 250 over and across the ceiling 225. It will be appreciated that the plurality of bars 250 may provide increased rigidity and mechanical strength relative to a single bar 250. For example, two bars 250 may be disposed such that they cross (e.g., are perpendicular) to each other. The bars 250 may be disposed in the space between pairs of the lids 210 as illustrated in FIG. 10. In some embodiments, the lift mechanism 260 may be disposed at an intersection of the bars 250. In some other embodiments, the lift mechanism 260 may be disposed along one of the bars 250 and apart from the other of the bars 250.

Figure 12:
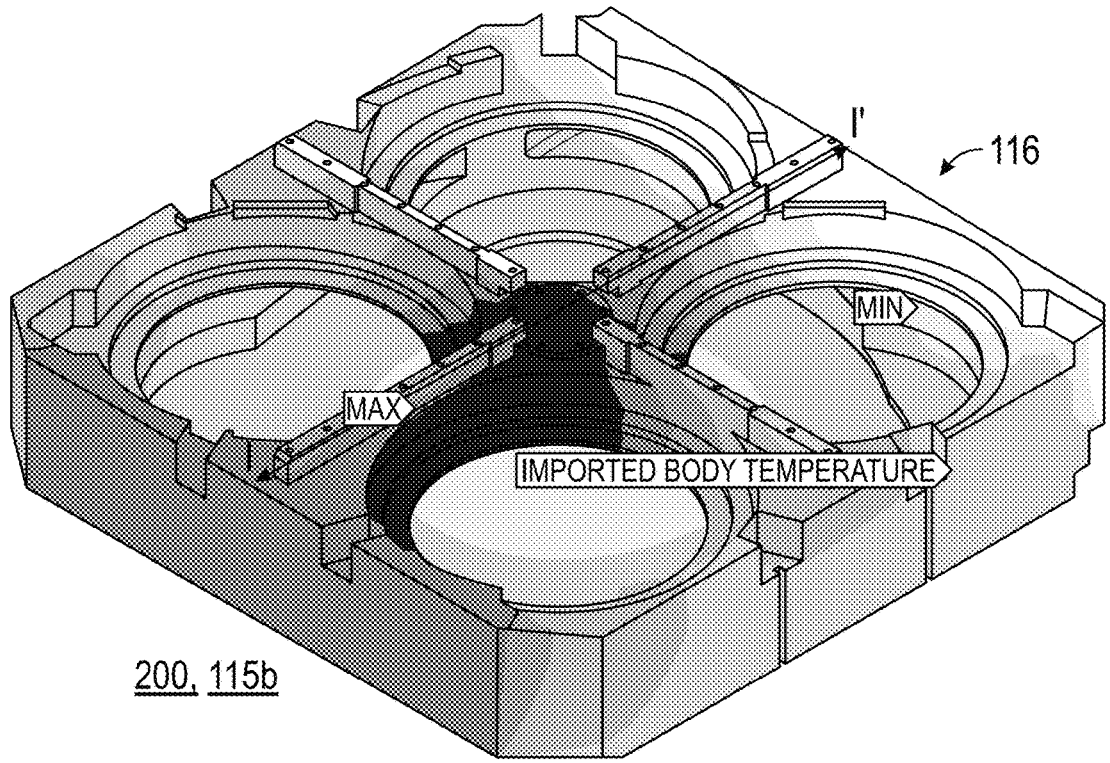
FIG. 12 is a perspective view of a process module of the substrate processing system for showing a temperature gradient.

FIG. 12 is a perspective view of a process module showing a temperature gradient. As discussed herein, the illustrated process module 200 may correspond to any of the process modules 115a, 115b, 115c, 115d of FIG. 1. The process module 115b may be selected as an example for discussion. Other process modules 115a, 115c, 115d may show a similar temperature gradient. Referring FIG. 12, this figure may be understood to show portion A of FIG. 1, including the process module 115b, in detail. The process module 115b is connected to the transfer chamber 118 on the side having the doors 116. While processing substrates in the process module 115b, temperature gradient I-I' may occur because of heat loss from the process module 115b to the transfer chamber 118 due to the temperature difference between the process module 115b and the transfer chamber 118 as illustrated in FIG. 12. For example, it will be appreciated that the transfer chamber 118 may not be heated or may not be at the same high temperature as the process module 115b. Thus, I may be at higher temperature than I', and central portions of the process module 200 may have temperatures higher than both I and I'. As a result, there may be a larger temperature differential between I' and the central portions of the process chamber 200 than between I and those central portions. In some embodiments, to compensate for the temperature gradients, the shape of the ceiling 225 may be asymmetric, e.g., may have an asymmetric convex shape, an asymmetric arc shape, an asymmetric pyramid shape, or an asymmetric curved shape.

Figure 13:
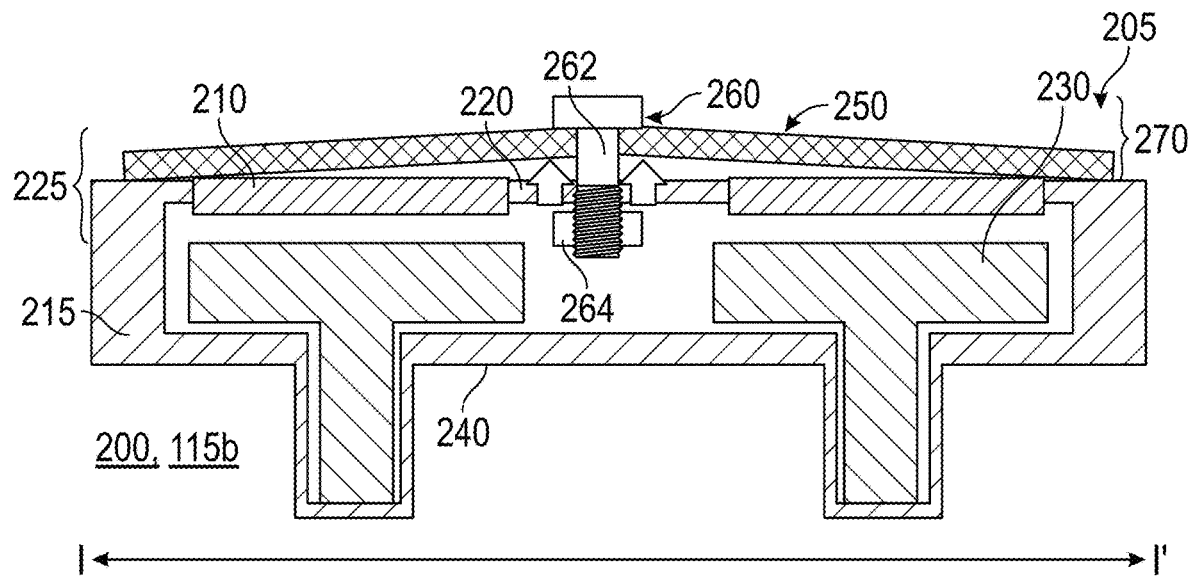
FIG. 13 is a schematic cross-sectional view of a process module of the substrate processing system in FIG. 11.

For example, referring to FIG. 13, to provide the asymmetric shape, the lift mechanism 260 may be off-center on the ceiling 225. The lift mechanism 260 may be disposed closer to the higher temperature side of the process module. For example, the lift mechanism 260 may be disposed further from the transfer chamber 118 and closer to the side of the process module opposite the door 116 and the transfer chamber 118. Thus, when the lift mechanism 260 applies a force to lift the ceiling, the ceiling may have an asymmetric convex shape, arc shape, pyramid shape or curved shape, with the apex of the shape being closer to the higher temperature side of the process module, to counteract the likely increase susceptibility of the ceiling 225 to sag at that part of the ceiling 225.

Figure 14:
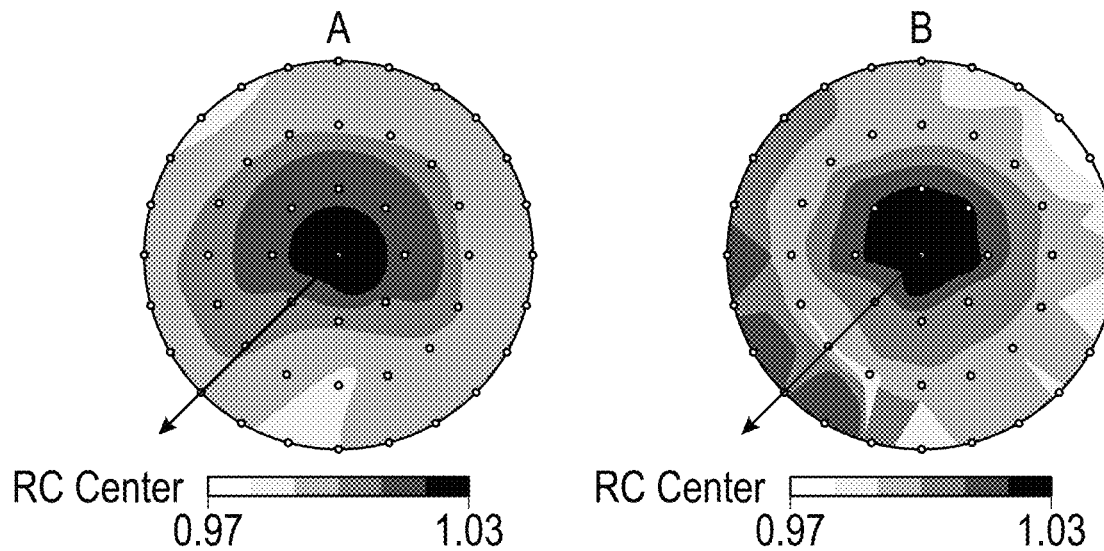
FIG. 14 shows a comparison of deposition process results between a process module having a convex-shaped ceiling and a similar process module having a flat ceiling.

FIG. 14 shows deposition process results using a process module having a convex-shaped ceiling according to some embodiments, and using a similar process module having a flat-shaped ceiling. The deposition was a PE ALD deposition to deposit SiN film in quad chamber module(QCM) commercially available from ASM International N.V. The SiN film was deposited under the following conditions: 400-550° C., 10-30 Ton, 500-800 W (13.56 MHz-27 MHz) using a silicon precursor and a nitrogen reactant. The results are believed to be representative of depositions with various silicon precursors (for example, aminosilane, halogenated silane, monosilane, and disilane) and various nitrogen reactant (for example, $N_2$, $N_2/H_2$, $NH_3$, etc.).

With continued reference to FIG. 14, to achieve result A, the center portion of the ceiling of the process module was 0.8 millimeters higher than the peripheral portion of the ceiling. For result B in FIG. 14, the process module had a flat-shaped ceiling. The process conditions were the same for A and B. Where the process module had the convex-shaped ceiling, the ceiling is understood to have become flattened during the deposition process due to the temperature and/or the pressure utilized in the deposition process. Thus, during the deposition process, the lid of the process module may be understood to be parallel to the stage, which facilitates uniform deposition, as illustrated in A of FIG. 14. On the other hand, where the process module initially has a flat ceiling, the central portions of the ceiling may sag due to the temperate and/or the pressure generated by the deposition process. Thus, during the deposition process, the lid of the process module is stood to not be parallel to the stage, which causes an uneven deposition result as illustrated in B of FIG. 14.

Figure 15:
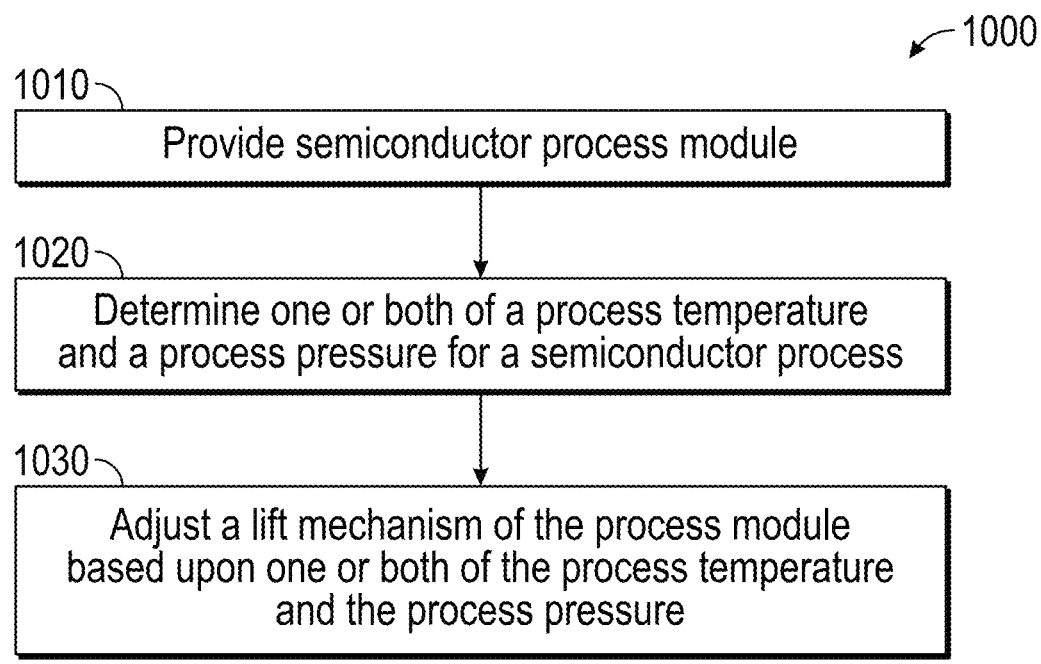
FIG. 15 is a flowchart illustrating a process for processing semiconductor substrates.

FIG. 15 is a flowchart illustrating a process 1000 for processing semiconductor substrates. At block 1010, a semiconductor process module is provided. The semiconductor process module may be the process module 200 discussed herein. For example, the process module may comprise a housing enclosing a plurality of stages for accommodating a plurality of semiconductor substrates for processing, and a rigid structure disposed over the lid assembly. The housing may comprise a bottom, a ceiling, and sidewalls extending from the bottom to the lid assembly. The ceiling may be a lid assembly, which may comprise a plurality of lids each corresponding to one of the plurality of stages. The rigid structure may comprise an adjustable lift mechanism attached to the ceiling for changing a shape of the ceiling.

At block, 1020, a process temperature and a process pressure for a semiconductor process is determined.

At block, 1030, the lift mechanism is adjusted based upon one or both of the process temperature and process pressure. In some embodiments, the adjustment of the lift mechanism may comprise changing a shape of the lid assembly based upon both the process temperature and process pressure. The change of the shape of the lid assembly may comprise increasing a height of a portion of the lid assembly attached to the lift mechanism, to define a shape having a bulge. For example, the height of the apex of the bulge may increase with increasing temperature and/or increasing pressure differentials between a low pressure in the process module and a higher pressure in the ambient environment.

In some embodiments, the process 1000 may further comprise heating the plurality of stages to the process temperature and evacuating the plurality of stages to the process pressure. In some embodiments, the process 1000 may further comprise subsequently processing a plurality of semiconductor substrates in the plurality of stages. In some embodiments, heating the plurality of stages to the process temperature and evacuating the plurality of stages to the process pressure flattens an upward deflection of the shape of the lid assembly. In some embodiments, the ceiling of the process module may be shaped so that the lids may be parallel to the stages during processing semiconductor substrates. In some embodiments, the process 1000 may be utilized to process semiconductor substrates. In some embodiments, the process 1000 may be utilized to process LCD panels.

Although in the foregoing description the invention is illustrated with reference to some embodiments, it is not so limited. Indeed, various modifications of the invention in addition to those shown and described herein will become apparent to those skilled in the art from the foregoing description and fall within the scope of the appended claims. In all of the disclosed embodiments, any element used in some embodiments may interchangeably or additionally be used in another embodiment unless such a replacement is not feasible or causes adverse effect or does not work for its intended purposes. All publications, patents and patent applications cited herein are hereby incorporated by reference in their entirety for all purposes to the same extent as if each individual publication, patent or patent application were specifically and individually indicated to be so incorporated by reference. Further details of the invention are provided in the following non-limiting examples.

Throughout this application, the use of singular includes the plural unless expressly stated otherwise. In this application, the use of "or" includes "and/or", unless expressly stated otherwise. Furthermore, the terms, "include," "including," and "included," are not limiting.

What is claimed is:

1. A process module for processing a substrate, the process module comprising:
   a plurality of stages each configured to accommodate a substrate,
   a region between the plurality of stages; and
   a housing enclosing the plurality of stages, the housing comprising a bottom, a ceiling, and a plurality of sidewalls extending from the bottom to the ceiling,
   wherein, as seen in a cross-sectional side view, a shape of the ceiling defines an upwardly extending bulge, and wherein an apex of the upwardly extending bulge is disposed above a region between the plurality of stages.

2. The process module of claim 1, wherein the housing further comprises a rigid structure disposed over and across the ceiling at the apex of the upwardly extending bulge, the rigid structure comprising a lift mechanism attached to the ceiling for maintaining an upward extension of the upwardly extending bulge.

3. The process module of claim 2, wherein the lift mechanism is adjustable for adjusting the height between the apex of the upwardly extending bulge and a peripheral portion of the ceiling in contact with the plurality of sidewalls.

4. The process module of claim 3, wherein the lift mechanism comprises a threaded rod attached to a corresponding threaded portion of the ceiling, where a height between the apex of the upwardly extending bulge and the peripheral portion of the ceiling in contact with the plurality of sidewalls is adjustable by relative rotation of the rod and the corresponding threaded portion of the ceiling.

5. The process module of claim 2, wherein the rigid structure comprises a rigid beam disposed over and across the ceiling.

6. The process module of claim 2, wherein the ceiling comprises a lid assembly comprising a plurality of lids corresponding to the plurality of stages, and wherein the rigid structure extends between pairs of the lids.

7. The process module of claim 1, wherein a plurality of lids is disposed over respective ones of the stages, wherein the plurality of lids are non-parallel to the respective stages.

8. The process module of claim 7, wherein a total number of the stages and the number of the lids are four each, wherein the stages and the lids are each arranged in a 2×2 matrix.

9. The process module of claim 1, wherein an apex of the bulge protrudes within a range of 0.2 millimeters to 4 millimeters higher than a periphery of the ceiling.

10. The process module of claim 1, wherein the bottom of the housing extends outward to form a convex shape.

11. A process module for processing a substrate comprising: one or more stages each configured to accommodate a substrate;
   a housing enclosing the one or more stages, the housing comprising a bottom, a ceiling, and sidewalls extending from the bottom to a lid assembly; and
   a rigid structure disposed over the ceiling, the rigid structure comprising a beam with a first end and a second end, wherein the first end and the second end of the beam are connected to the ceiling, the rigid structure further comprising an adjustable lift mechanism attached to the ceiling and the beam at a point between the first end and the second end of the beam, wherein the adjustable lift mechanism is configured to adjust a height between the ceiling and the point between the first end and the second end of the beam.

12. The process module of claim 11, wherein the beam is more rigid than the ceiling.

13. The process module of claim 11, wherein the lift mechanism comprises:
   a male thread; and
   a female thread configured to be coupled with and rotatable relative to the male thread,
   wherein one of the male and female threads is attached to the rigid structure and the other of the male and female threads is attached to the ceiling.

14. The process module of claim 11, wherein the lid assembly comprises a plurality of lids,
   wherein the number of the stages and the number of the lids are four, and
   wherein the stages and the lids are each arranged in a 2×2 matrix, and the rigid structure is disposed between two rows of two lids.

15. The process module of claim 11, wherein the point between the first end and the second end of the beam is off-center, as seen in a top-down view.

16. A semiconductor processing system comprising:
   a transfer chamber;
   one or more processing modules attached to the transfer chamber, the one or more processing modules each comprising:
      a plurality of stages each configured to accommodate a substrate;
      a housing enclosing the one or more stages, the housing comprising:
         a bottom;
         a ceiling;
         a door openable to the transfer chamber; and a sidewall opposite the door and extending from the bottom to the ceiling, wherein the ceiling has a convex shape as seen in a cross-section sideview, wherein the convex shape has an apex closer to the sidewall opposite the door than to the openable door.

17. The process module of claim 16, wherein the ceiling comprises a lid assembly, wherein each stage has a respective lid disposed in the lid assembly, wherein the convex shape is changeable into a flat shape, in which the lids are parallel to the respective stages, upon processing the substrates on the stages.

18. The process module of claim 16, further comprising a rigid structure having a lift mechanism for adjusting a height between the apex and a peripheral portion of the ceiling connected to the sidewall.

19. The process module of claim 18, wherein the lift mechanism comprises:

a male thread; and a female thread configured to be coupled with and be rotatable relative to the male thread, wherein one of the male and female threads is attached to the rigid structure and the other of the male and female threads is attached to the ceiling at the apex.

* * * * *